United States Patent [19]

Cohen

[11] 4,169,253

[45] Sep. 25, 1979

[54] FREQUENCY OFFSET TECHNIQUE FOR YIG DEVICES

[75] Inventor: Morris Cohen, Oceanside, N.Y.

[73] Assignee: Loral Corporation, Yonkers, N.Y.

[21] Appl. No.: 903,941

[22] Filed: May 8, 1978

[51] Int. Cl.² .......................... H03H 9/00; H04B 1/26

[52] U.S. Cl. .................................... 333/209; 333/207; 325/448

[58] Field of Search ................. 333/73 R, 73 C, 73 S, 333/73 W, 82 B, 82 R, 83 R; 325/448

[56] References Cited

U.S. PATENT DOCUMENTS

| | | | |
|---|---|---|---|
| 3,274,519 | 9/1966 | Nathanson | 333/73 W |
| 3,290,625 | 12/1966 | Bartram et al. | 333/73 R |
| 3,368,169 | 2/1968 | Carter et al. | 333/73 S |
| 3,434,057 | 3/1969 | Jackman et al. | 325/335 |
| 3,435,346 | 3/1969 | Allen et al. | 325/335 |
| 3,838,367 | 9/1974 | Bex | 333/73 S |
| 3,921,085 | 11/1975 | Keane | 333/73 R |

OTHER PUBLICATIONS

*IEE Trans on MTT*, May, 1965, pp. 306-315, Carter, P.S., "Side-Wall-Coupled, Strip Transmission-Line Magnetically Tunable Filters Employing Ferrimagnetic YIG Res".

*Primary Examiner*—Alfred E. Smith
*Assistant Examiner*—Harry E. Barlow
*Attorney, Agent, or Firm*—Charles E. Temico

[57] ABSTRACT

An improved electronic structure for achieving a frequency offset between two or more YIG devices tuned by a single electro-magnet. The structure does not require different sizes of YIG spheres, different magnet gap spacings, or modified coil windings on the electro-magnet, but relies entirely upon the anisotropy variations of the single crystal structure of the YIG spheres when they are mounted on respective tuning rods on a specific axis and rotated under a variable field for a fixed frequency input.

1 Claim, 7 Drawing Figures

FIG. 1
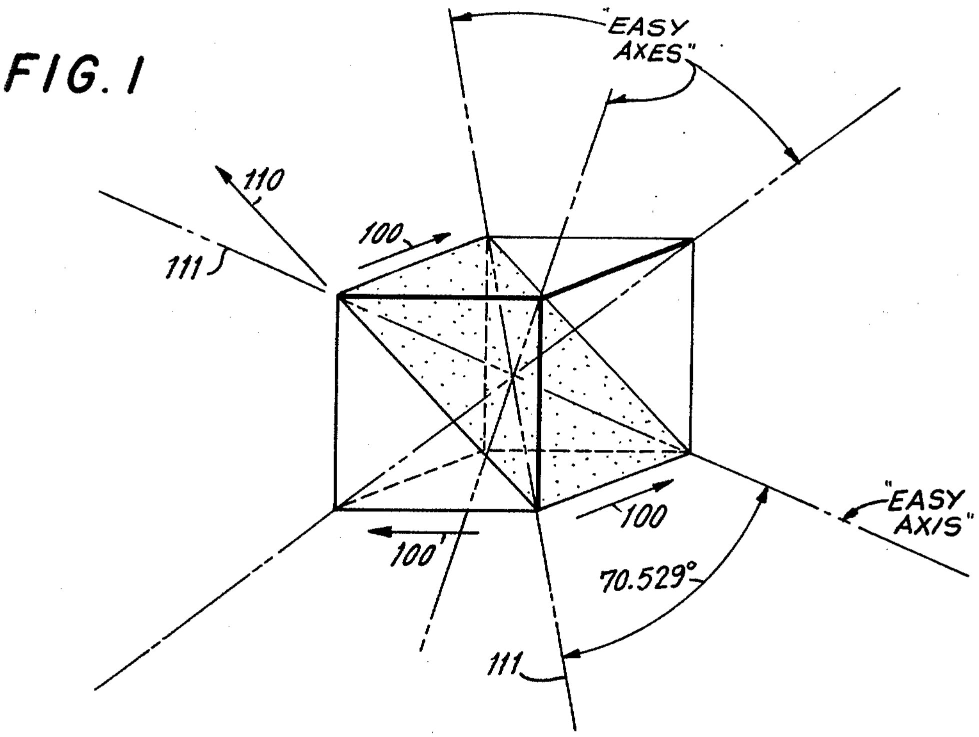
FIG. 2
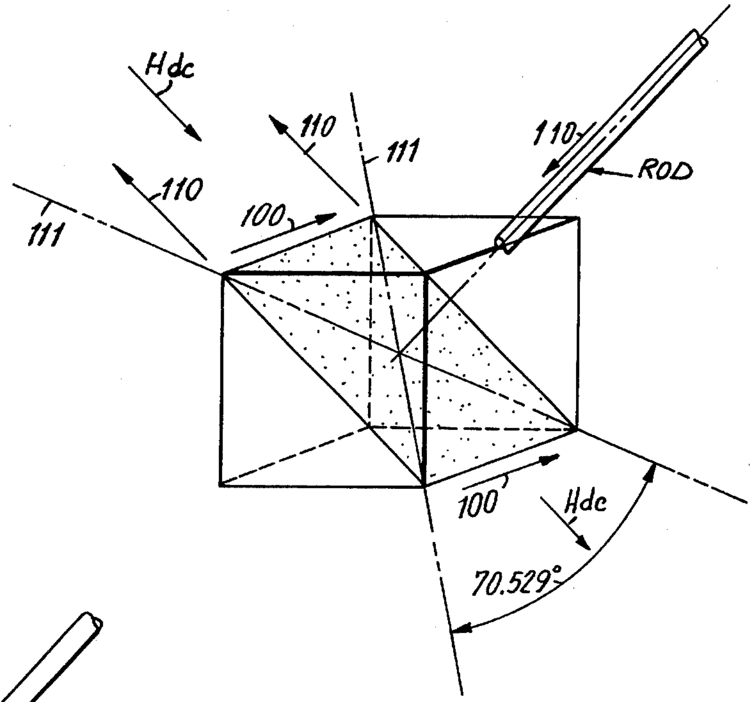
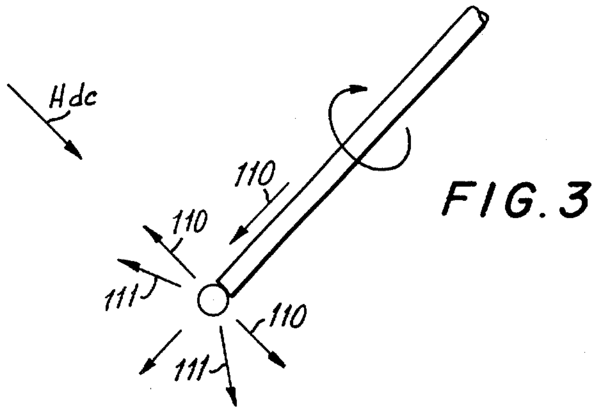
FIG. 3

SINGLE BALL PLATE

FREQUENCY OFFSET TECHNIQUE FOR YIG DEVICES

BACKGROUND OF THE INVENTION

This invention relates generally to the field of microwave technology, and more particularly to an improved frequency offset technique for use in devices in which an input signal is divided and fed to several YIG devices to provide different frequency outputs.

There are many instances where two or more YIG devices are employed in a microwave system. For example, a YIG pre-selector and a YIG tuned local oscillator in conjunction with a mixer can be found in many microwave receivers. Since the oscillator and pre-selector must be separated (in frequency) to yield the desired intermediate frequency (if) out of the mixer, it is necessary that each device be tuned to a different H field, i.e. a separate electro-magnet for each device.

SUMMARY OF THE INVENTION

Briefly stated, the invention contemplates the provision of an improved structure in which two or more tunable devices may be incorporated in a plate (housing) and tuned by a single electro-magnet to output discrete frequencies.. The plural devices will exhibit substantially fixed frequency offsets while tuned over a multi-octave frequency range. This is accomplished without resort to differing YIG sphere sizes, different magnet gaps or modified coil windings on the single electro-magnet employed. Rather, the frequency offset is obtained solely by relying upon the anisotropy variations of the single crystal structure of the YIG spheres when they are mounted to their respective tuning rods on a specific axis, and rotated under a variable H field for a fixed frequency input, i.e. the magnetic H field is adjusted to maintain YIG resonance at the fixed frequency for every degree rotation. This procedure allows all YIG spheres to be equal in size, and to be tuned under a uniform gap spacing.

BRIEF DESCRIPTION OF THE DRAWINGS

In the drawing, to which reference will be made in the specification;

FIG. 1 is a schematic view showing the theory of operation of an embodiment of the invention.

FIG. 2 is a similar schematic view showing the relative orientation of a YIG supporting and tuning rod.

FIG. 3 is a schematic view showing the alignment of tuning rod axis with the axis of a YIG sphere.

DETAILED DESCRIPTION OF THE DISCLOSED EMBODIMENT

Figure 4:
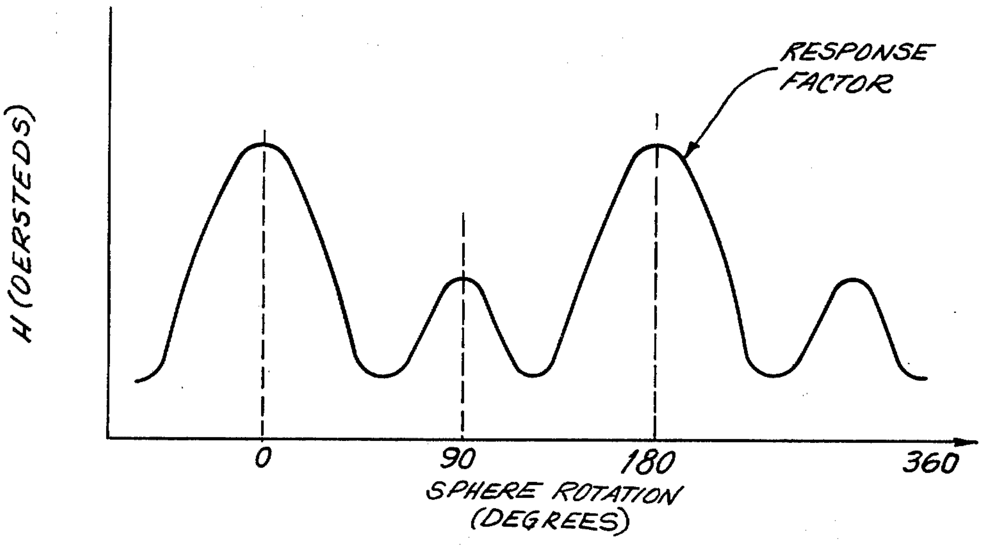
FIG. 4 is a graph showing response factor obtained at different degrees of rotation of a YIG sphere.

In accordance with the invention, the principal factor for accomplishing the elimination of multiple electro-magnets for plurable tunable devices lies in the mounting of the YIG spheres upon respective tuning rods, such that all spheres are mounted with the same axis parallel to the axis of the tuning rods, the rods themselves being coaxially disposed. When this is the case, all spheres will exhibit a similar "response factor" when placed in a magnetic field and rotated through 360°, i.e. for a variable H field and a fixed input frequency, the resonant frequency will require different values of H versus degree ($\theta$) rotation, as expressed by the following equation.

$$Ho = \frac{fo\,(MH_z)}{2.8} - (2 - 5/2\sin^2\theta\ 15/8\sin^2 2\theta)\,K_1/M_s \qquad (a)$$

where $f_o$=resonant frequency $\theta$=degree rotation $K_l/M_s$=First order anisotropy constant (for YIG=−43 Oersteds)

$H_o$=perpendicular magnetic field (Oersteds)

Referring to FIG. 1 in the drawing, there is illustrated a hypothetical YIG cube crystal and its pertinent axes 111, 110, and 100. The 111 axis is denoted as the "easy axis," since it will readily align itself to a magnetic field. The shaded area in this figure represents the plane, containing two easy axes (111), i.e., the diagonal axes in the shaded plane, and that they are 70.53 degrees apart. Therefore, if two sets of electro-magnets were to be set 70.53 degrees apart in a horizontal plane with a YIG sphere placed in a very low friction mount centered between the magnets, the activation of each pair of magnets (one pair at a time) would align the two "easy axes." At this point, a pre-glued rod brought in perpendicular to the plane (as shown in FIG. 2) would mount to the sphere perpendicular to 110 plane, and parallel to the 110 axis.

FIG. 3 illustrates the YIG sphere mounted to the tuning rod and how the axes would appear to the applied magnetic field with rod rotation.

Figure 5:
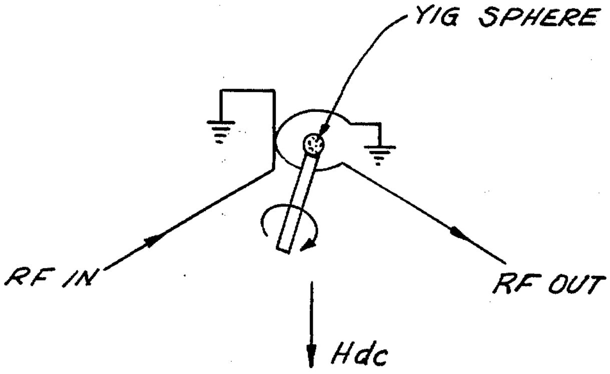
FIG. 5 is a schematic view showing a conventional single ball plate of known type.

When the sphere is mounted upon the tuning rod, the rod-sphere assembly is placed in a loop coupled single sphere plate (FIG. 5) with a fixed input rf frequency, rotated in the plate under a variable magnetic field. The magnetic field (H) is varied with degree rotation of the YIG sphere to maintain resonance at the fixed input frequency. This variation of magnetic field (H) versus sphere rotation is observed and plotted (FIG. 4). The resulting curve is denoted as "response factor."

Since all spheres are mounted in a similar manner, they will, under similar test, exhibit the same "response factor."

The disclosed invention makes use of the "response factor" and the equation (a). A rearrangement of the equation yields the resonant frequency ($f_o$) for a fixed H field in terms of the degree of sphere rotation.

$$f_o(MH_z)=2.8[H_o+(2-5/2\sin^2\theta-15/18\sin^2 2\theta)K_l/M_s] \qquad (b)$$

for example, if $H_o$=3000 Oersteds and $\theta$=0 degrees $f_{o1}$=8159.2 $MH_z$ and if $H_o$=3000 Oersteds and $\theta$=15 degrees $f_{o2}$=8235.8 $MH_z$ Therefore, $$f=f_{o2}-f_{o1}=76.6\ MH_z$$

In effect the Δf indicates a frequency offset of 76.6 MHz. Therefore, if two YIG spheres (both mounted with the 110 axis parallel to the tuning rod) were placed under a common magnet having an H field equal to 3000 Oersteds and one sphere set at 0 degrees while the other was set at 15 degrees, the two would be offset by 76.6 MHz, and since from the equation it is evident that the offset is a constant, the two spheres will be offset by the same frequency amount for any value of applied magnetic field.

Figure 6:
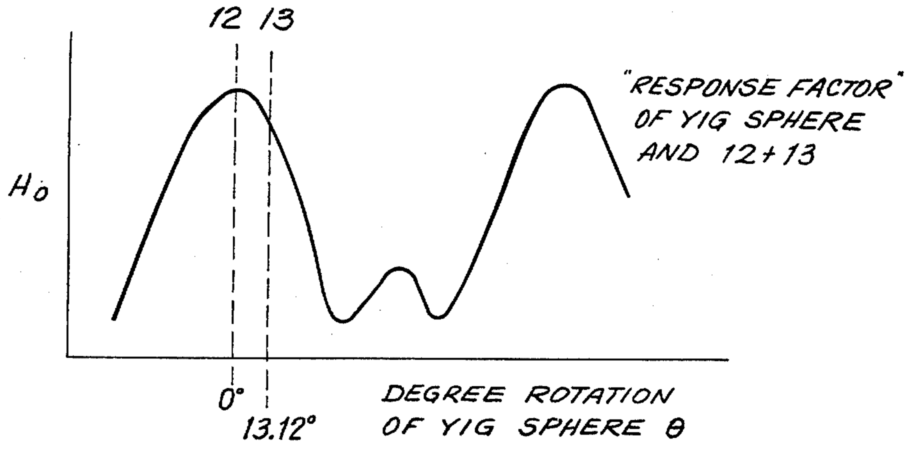
FIG. 6 is a graph showing the difference in response factor between two YIG spheres in a pair of related tunable elements.
Figure 7:
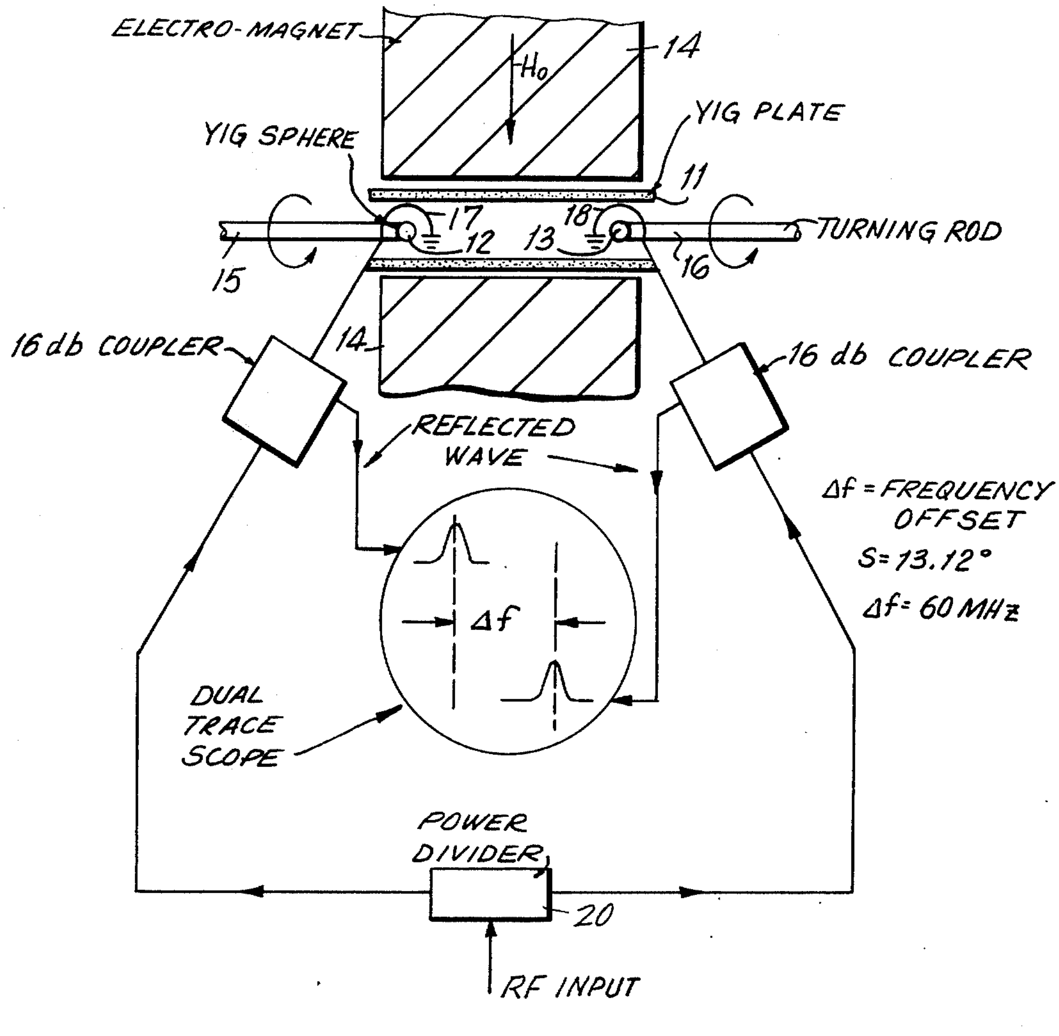
FIG. 7 is a schematic view of an embodiment of the invention.

Referring now to the embodiment shown in FIG. 7, and related graph in FIG. 6, experiments were performed using a common plate (housing) 11 for two equally sized YIG spheres, 12 and 13, and a single electro-magnet 14 having a substantially uniform gap opening. The spheres are mounted to tuning rods 15 and 16, as described supra, and are inserted at each end of the plate. Each sphere is placed under a single loop 17 and 18, and the response of both YIG spheres displayed on a dual trace scope 19. Both coupling loops are fed the same rf input frequency (via a power divider 20).

Instituting a test procedure, for a given input frequency, e.g. 3000 MHz, the spheres 12 and 13 are set to resonate at the highest value of the magnetic field $H_o$ which corresponds to 0 degrees on the "response factor" curve, this point constituting an index. At this point, both spheres are resonant at 3000 MHz and their reflection responses are congruent on the dual trace scope.

At 3000 MHz, keeping $H_o$ fixed, sphere 13 is rotated 13.12 degrees, following which it is noted that the reflected resonance response for sphere 13 changes to 3060 MHz, i.e. a 60 MHz offset from that of sphere 12. In effect for the same value of magnetic field (H in Oersteds), sphere 13 will resonate at a higher frequency due to a variation in anisotropy, in accordance with the equation (a).

Next, both spheres are locked in place, and the input frequency is changed to 2000 MHz and the electro-magnet is varied to resonate sphere 12 at 2000 MHz, at which time it is noted that sphere 13 resonates at 2060 MHz.

The input frequency may be further altered, and the resonant frequencies for spheres 12 and 13 noted. Using two different offset frequencies, 60 MHz and 160 MHz, the following results were observed.

| Input Frequency MHz | Sphere Resonant Frequency MHz 12 | 13 | Offset Frequency MHz |
|---|---|---|---|
| 2000 | 2000 | 2060 | 60 |
| 3000 | 3000 | 3060 | 60 |
| 4000 | 4000 | 4058 | 58 |
| 5000 | 5000 | 5059 | 59 |
| 6000 | 6000 | 6060 | 60 |
| 7000 | 7000 | 7058 | 58 |
| 8000 | 8000 | 8059 | 59 |
| 9000 | 9000 | 9060 | 60 |
| 10000 | 10000 | 10060 | 60 |
| 11000 | 11000 | 11061 | 61 |
| 12000 | 12000 | 12061 | 61 |
| 13000 | 13000 | 13060 | 60 |

-continued

| Input Frequency MHz | Sphere Resonant Frequency MHz 12 | 13 | Offset Frequency MHz |
|---|---|---|---|
| 14000 | 14000 | 14062 | 62 |
| 15000 | 15000 | 15062 | 62 |
| 17000 | 17000 | 17066 | 66 |
| 18000 | 18000 | 18066 | 66 |
| 2000 | 2000 | 2157 | 157 |
| 3000 | 3000 | 3157 | 157 |
| 4000 | 4000 | 4157 | 157 |
| 5000 | 5000 | 5159 | 159 |
| 6000 | 6000 | 6159 | 159 |
| 7000 | 7000 | 7159 | 159 |
| 8000 | 8000 | 8160 | 160 |
| 9000 | 9000 | 9162 | 162 |
| 10000 | 10000 | 10162 | 162 |
| 11000 | 11000 | 11161 | 161 |
| 12000 | 12000 | 12162 | 162 |
| 13000 | 13000 | 13163 | 163 |
| 14000 | 14000 | 14163 | 163 |
| 15000 | 15000 | 15164 | 164 |
| 16000 | 16000 | 16164 | 164 |
| 17000 | 17000 | 17164 | 164 |
| 18000 | 18000 | 18165 | 165 |

It may thus be seen that I have invented a novel structure for achieving a fixed frequency offset between two YIG devices operating over multi-octave frequency bands, employing only a single electro-magnet. In terms of system advantage, the use of a single electro-magnet represents a saving in size, weight, power drain, heat, tracking between the two devices and driver requirements.

I wish it to be understood that I do not consider the invention limited to the precise details shown and set forth in this specification, for obvious modifications will occur to those skilled in the art to which the invention pertains.

I claim:

1. The method of producing in a pair of YIG devices, a relatively fixed frequency offset between the outputs of said devices, comprising the steps of:

Providing a single electro-magnet defining a substantially constant operative gap;

Mounting said YIG devices upon coaxially aligned rods within a single housing disposed within said gap, such that each device may be rotated about its 110 axis, with a single loop surrounding each device;

Determining an index point for each device at which both devices output the same frequency at resonance in response to a given input frequency and given magnetic field; and Rotating one of said rods relative to the other to a degree sufficient to obtain a frequency output at resonance equivalent to the desired frequency offset, in accordance with the formula:

$$H_o = \frac{f_o\,(MH_z)}{2.8} - (2\text{-}5/2 \sin^2\theta\ 15/8 \sin^2 2\theta)\ K_1/M^s$$

where $f_o$=resonant frequency $\theta$=degree rotation $K_l/M_s$=First order anisotropy constant for YIG=−43 Oersteds)

$H_o$=perpendicular magnetic field (Oersteds)

* * * * *